(12) United States Patent
Shonai et al.

(10) Patent No.: US 8,585,346 B2
(45) Date of Patent: Nov. 19, 2013

(54) HANDLING DEVICE AND HANDLING METHOD OF QUARTZ GLASS CRUCIBLE

(75) Inventors: Manabu Shonai, Akita (JP); Taira Sato, Akita (JP); Minoru Shirakawa, Akita (JP); Hiroshi Takahashi, Akita (JP); Shuichi Ikehata, Akita (JP)

(73) Assignee: Japan Super Quartz Corporation, Akita-shi (JP)

(*) Notice: Subject to any disclaimer, the term of this patent is extended or adjusted under 35 U.S.C. 154(b) by 400 days.

(21) Appl. No.: 12/804,479

(22) Filed: Jul. 21, 2010

(65) Prior Publication Data

US 2011/0020103 A1    Jan. 27, 2011

(30) Foreign Application Priority Data

Jul. 22, 2009  (JP) ................................ 2009-171351
Jun. 29, 2010  (JP) ................................ 2010-147502

(51) Int. Cl.
  *B23Q 1/52* (2006.01)
  *B65G 47/90* (2006.01)

(52) U.S. Cl.
  USPC .................. 414/783; 414/420; 294/119.1

(58) Field of Classification Search
  USPC .......... 294/103.2, 119.1, 196, 201, 207, 81.4, 294/81.54, 81.62, 902; 414/226.02, 405, 414/419–422, 433, 450, 622, 735, 739, 740, 414/741, 746.3, 746.8, 758, 776, 783, 910, 414/911; 910/31, 39
  See application file for complete search history.

(56) References Cited

U.S. PATENT DOCUMENTS 1,516,973 A * 11/1924 Loughran ............... 294/81.62
2,530,333 A * 11/1950 Jost ........................... 73/45.8

(Continued)

FOREIGN PATENT DOCUMENTS

CN            200995341          12/2007
DE      20 2005 007 347 U1       7/2005

(Continued)

OTHER PUBLICATIONS

Chinese Office Action dated Aug. 31, 2011 in Chinese Application No. 201010235434.1.

(Continued)

*Primary Examiner* — Gregory Adams
(74) *Attorney, Agent, or Firm* — Christensen O'Connor Johnson Kindness PLLC

(57) ABSTRACT

An object of the present invention is to provide a crucible handling device that can firmly sandwich and reliably move a quartz glass crucible under a clean environment and a method of handling a quartz glass crucible using the crucible handling device. The present invention provides a crucible handling device 1 for handling a quartz glass crucible 5, the device including: a frame 4 having a beam 2 extending in a horizontal direction and a pair of arms 3 protruding from the beam 2 in a direction perpendicular to a central axis line direction of the beam 2 such that at least one of the arms 3 is able to move in the central axis line direction of the beam 2; a pair of sandwiching means 6 assembled with the pair of the arm 3 to face each other, for sandwiching a body 50 of the quartz glass crucible 5 in a radial direction of the crucible; engagement means 7 provided adjacent to each sandwiching means 6 and formed by a pair of tongues 70 movable to approach or be separated from each other in a central axis direction of the crucible, for sandwiching and holding the quartz glass crucible 5 therebetween in the central axis direction of the crucible; and driving means 8 for causing the sandwiching means 6 and the engagement means 7 to reciprocate along the arm 3. The present invention also provides a method of handling a quartz glass crucible using such a device 1 as described above.

7 Claims, 4 Drawing Sheets

(56) References Cited

U.S. PATENT DOCUMENTS

| | | | | |
|---|---|---|---|---|
| 2,647,650 | A * | 8/1953 | Sherriff | 414/620 |
| 2,815,547 | A * | 12/1957 | Hedderich | 164/261 |
| 4,042,122 | A * | 8/1977 | Espy et al. | 414/728 |
| 4,202,403 | A * | 5/1980 | Miller | 164/409 |
| 4,256,429 | A * | 3/1981 | Dwyer | 414/626 |
| 4,496,275 | A * | 1/1985 | Harp | 414/420 |
| 4,546,681 | A * | 10/1985 | Owsen | 82/162 |
| 4,660,406 | A * | 4/1987 | Rugh et al. | 72/448 |
| 4,715,637 | A * | 12/1987 | Hosoda et al. | 294/86.4 |
| 4,842,473 | A * | 6/1989 | Zbornik | 414/626 |
| 5,120,101 | A * | 6/1992 | Vranish | 294/119.1 |
| 5,421,889 | A * | 6/1995 | Pollock et al. | 118/719 |
| 5,924,545 | A * | 7/1999 | Crorey | 198/375 |
| 6,142,725 | A * | 11/2000 | Crorey | 414/753.1 |
| 2004/0051328 | A1 * | 3/2004 | Cinotti et al. | 294/119.1 |
| 2005/0013684 | A1 * | 1/2005 | Wu | 414/783 |

FOREIGN PATENT DOCUMENTS

| | | |
|---|---|---|
| EP | 1 870 355 A1 | 12/2007 |
| JP | 5-286686 A | 11/1993 |
| JP | 2000-219207 | 8/2000 |
| JP | 2002-029886 | 1/2002 |

OTHER PUBLICATIONS

Extended European Search Report mailed Feb. 15, 2012, issued in corresponding Application No. EP 10 25 13 09, filed Jul. 22, 2010, 4 pages.

* cited by examiner

HANDLING DEVICE AND HANDLING METHOD OF QUARTZ GLASS CRUCIBLE

RELATED APPLICATIONS

This application is based on and claims priority from Japanese Patent Application No. 2009-171351, filed on Jul. 22, 2009 and Japanese Patent Application No. 2010-147502, filed on Jun. 29, 2010 in the Japanese Intellectual Property Office, which are incorporated herein in their entirety by reference.

BACKGROUND OF THE INVENTION

1. Field of the Invention

The present invention relates to a handling device of a quartz glass crucible that sandwiches and transfers a quartz glass crucible under a clean environment, and, in particular, to a handling device that can firmly sandwich and reliably move the quartz glass crucible. The present invention also relates to a method of handling a quartz glass crucible using the handling device.

2. Description of the Related Art

In general, after being manufactured, a quartz glass crucible is washed, inspected, and packed to be shipped. However, as increasingly high purity is required for semiconductor materials, it has been demanded that contamination of a quartz glass crucible itself be minimized and thus a quartz glass crucible is further washed by using ultrapure water and the like before the quartz glass crucible is used for pulling up single crystals. On the other hand, to increase the manufacturing efficiency of single crystal silicon by using the Czochralski (Cz) method and the like, the size of a quartz glass crucible is made increasingly larger. This results in difficulty in handling of the quartz glass crucible, which is likely to cause the quartz glass crucible to be contaminated during inspection or packing operation after manufacture. Especially, a quartz glass crucible is quite likely to be contaminated when the quartz glass crucible is packed while being handled by two workers. To avoid such a problem as this, JP 2000-219207 Laid-Open discloses mechanically packing a quartz glass crucible in a condition where the quartz glass crucible is clean after being washed.

SUMMARY OF THE INVENTION

However, a handling operation is not necessarily easy at the time of mechanically packing a quartz glass crucible, especially, a relatively large one having, for example, a diameter of 63 cm or over. When a quartz glass crucible is mechanically packed according to the current practice, the quartz glass crucible is generally packed with a single layer of a highly cleaned clean bag under a clean environment and then packed with at least one normal bag having less cleanliness than the clean bag. Therefore, when a crucible handling device attempts to handle a quartz glass crucible which has been packed, by lifting or rotating it, the handling device may not be able to handle the quartz glass crucible properly by firmly sandwiching the crucible because a slippery polyethylene packing member or the like exists between the crucible and the handling device. Note that the "clean environment" as used in the present specification represents an environment under the cleanliness of class 10000 (i.e. the number of particles having a size of 0.5 μm in 0.0283 m$^3$ is 10000 or below) as set forth in Federal Standard 209E in United States of America.

In view of the circumstance described above, one object of the present invention is to improve a quartz glass crucible handling device which has not been sufficiently studied in the past, to provide a quartz glass crucible handling device that, if one or more layers of packing are applied to the crucible, can firmly sandwich and reliably move the quartz glass crucible. Further, another object of the present invention is to provide a method of handling a quartz glass crucible by using the handling device.

In order to achieve the one object described above, in a first aspect of the present invention, a crucible handling device for sandwiching and moving a quartz glass crucible includes: a frame having a beam extending in a horizontal direction and a pair of arms protruding from the beam in a direction perpendicular to a central axis direction of the beam such that at least one of the arms is able to move in the central axis direction of the beam; a pair of sandwiching means assembled with the pair of the arm to face each other, for sandwiching a body of the quartz glass crucible in a radial direction of the crucible; engagement means provided adjacent to each sandwiching means and formed by a pair of tongues movable to approach or be separated from each other in a central axis direction of the crucible, for sandwiching and holding the quartz glass crucible between the tongues in the central axis direction of the crucible; and driving means for causing the frame to reciprocate along the central axis of the quartz glass crucible.

Further, in the first aspect of the present invention, it is preferable that the crucible handling device further includes pivoting means attached to each of the arms, for pivoting the quartz glass crucible around an imaginary line passing through the pair of sandwiching means and extending in a direction perpendicular to the central axis of the crucible.

Yet further, in the first aspect of the present invention, it is preferable that each sandwiching means has at least one roller and that an axis line of each roller extends in the central axis direction of the crucible. In the present invention, it is preferable that the sandwiching means includes a plurality of rollers and that the plurality of rollers are spaced apart from each other. Further, it is preferable that each roller has an elastic layer in the outer periphery thereof.

Yet further, in the first aspect of the present invention, it is preferable that at least one of the pair of tongues is swingable with respect to the central axis direction of the crucible.

Yet further, in the first aspect of the present invention, it is preferable that the pair of tongues each include an elastic member.

In a second aspect of the present invention, a method for handling a quartz glass crucible by using a device for handling a quartz glass crucible of the first aspect of the invention, includes: sandwiching a body of the quartz glass crucible placed on a stage in the radial direction of the crucible; sandwiching and holding the quartz glass crucible placed on the stage in the central axis direction of the crucible; lifting up the quartz glass crucible; placing the quartz glass crucible on the stage again; and, releasing the quartz glass crucible from the sandwiching and holding engagement by the crucible handling device.

Further, in the second aspect of the present invention, it is preferable that the method further includes pivoting the quartz glass crucible after lifting up the quartz glass crucible.

According to the present invention, it is possible to provide a crucible handling device that can, if one or more layers of packing are applied to a quartz glass crucible, firmly sandwich and reliably move the quartz glass crucible by optimizing a configuration of the crucible handling device. Further, it is possible to provide a method of handling a quartz glass crucible by using the crucible handling device.

DESCRIPTION OF THE PREFERRED EMBODIMENTS

Figure 1:
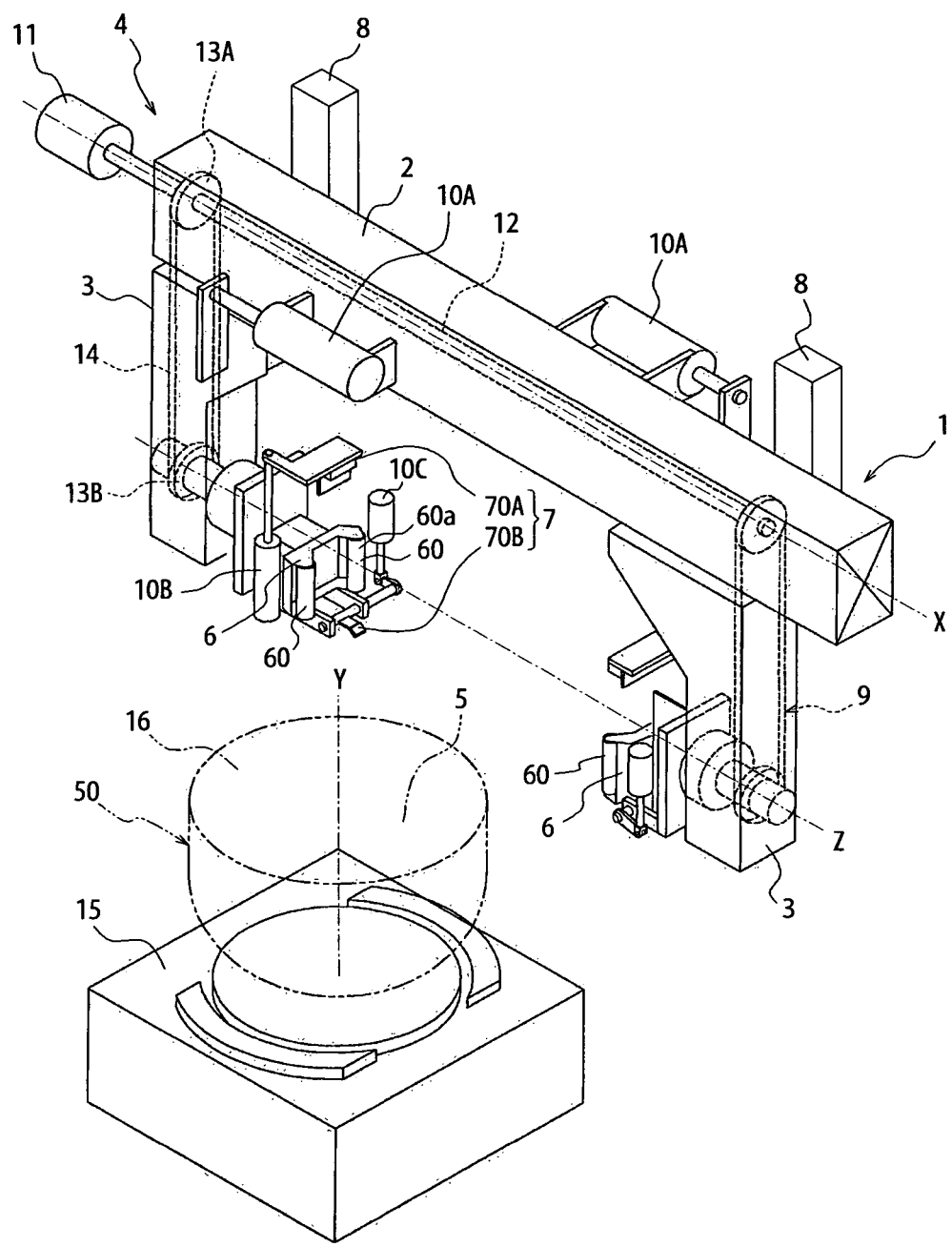
FIG. 1 is a perspective view showing a crucible handling device according to the present invention.
Figure 2:
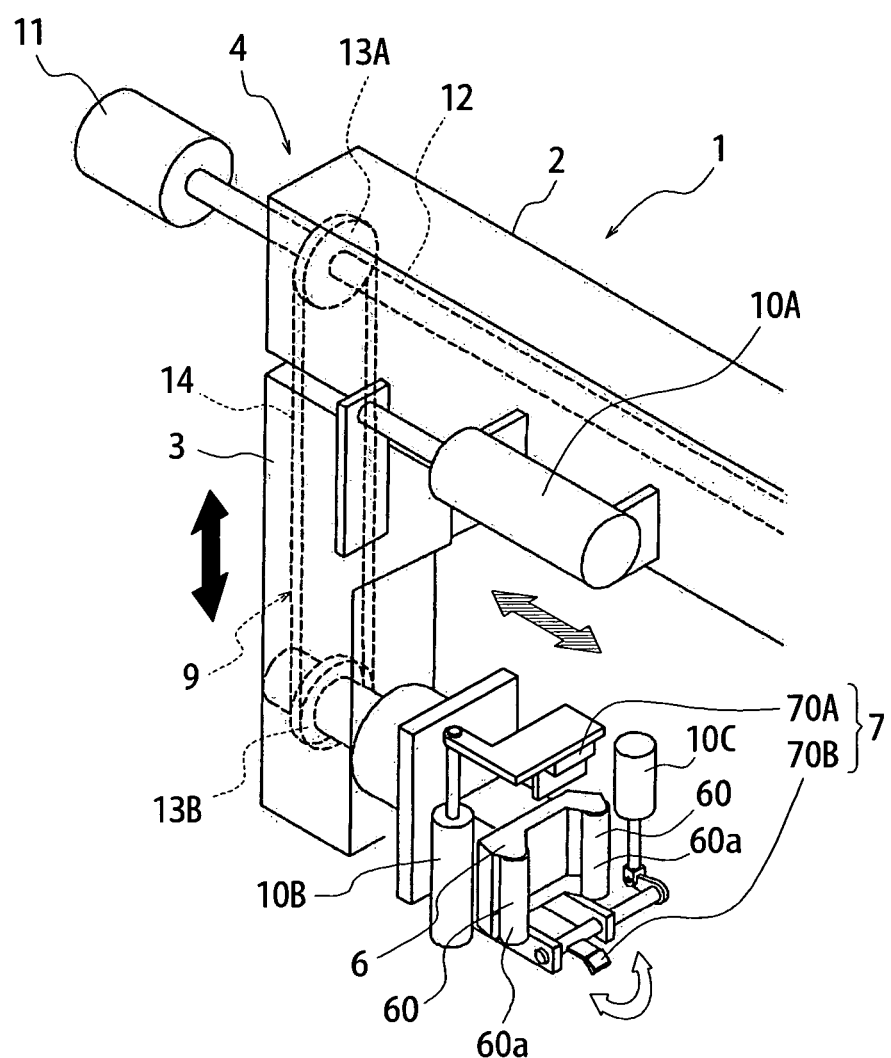
FIG. 2 is a partial perspective view of the crucible handling device according to the present invention.
Figure 3:
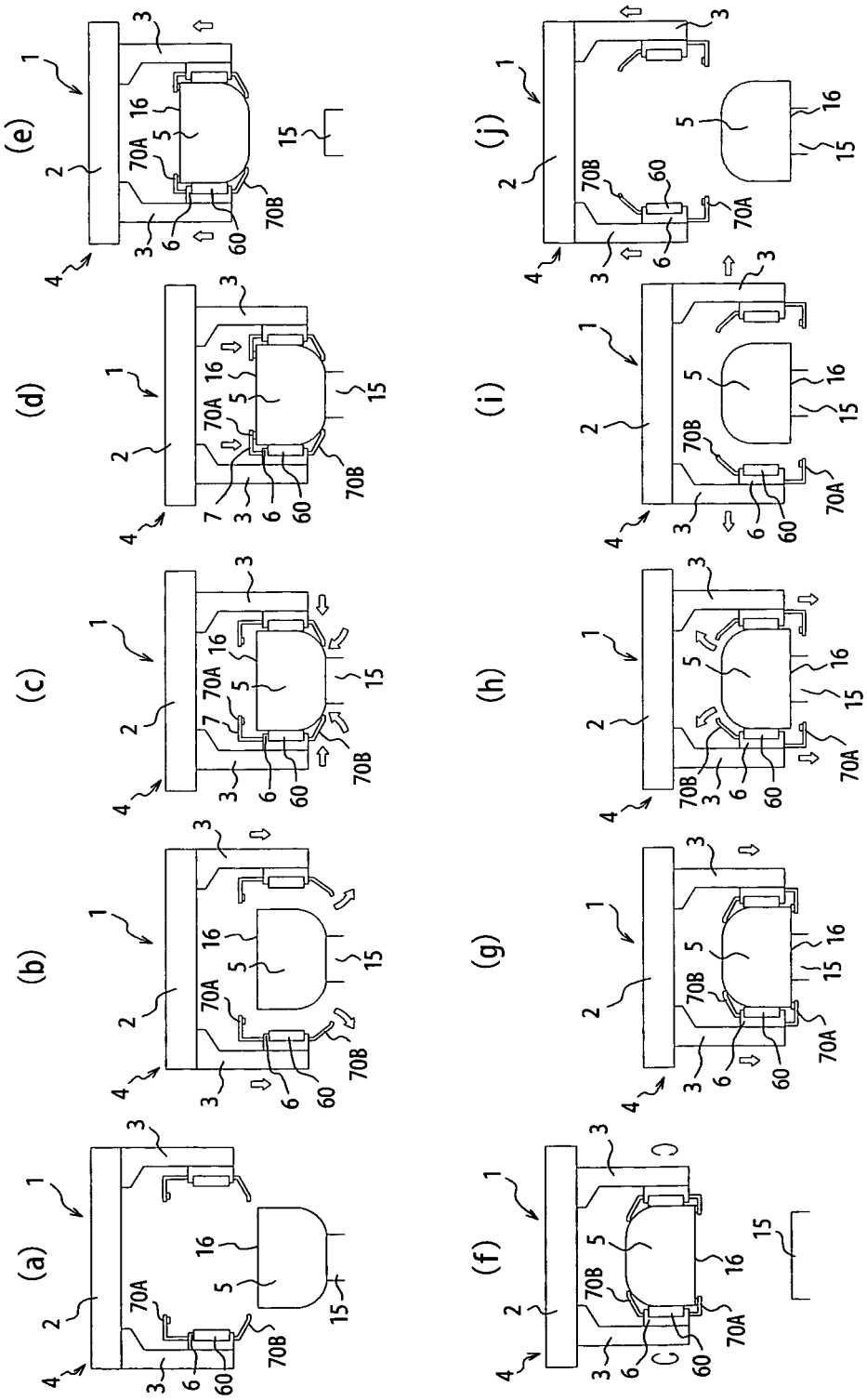
FIGS. 3A through 3J are diagrams showing processes of handling a quartz glass crucible by using the handling device according to the present invention.
Figure 4:
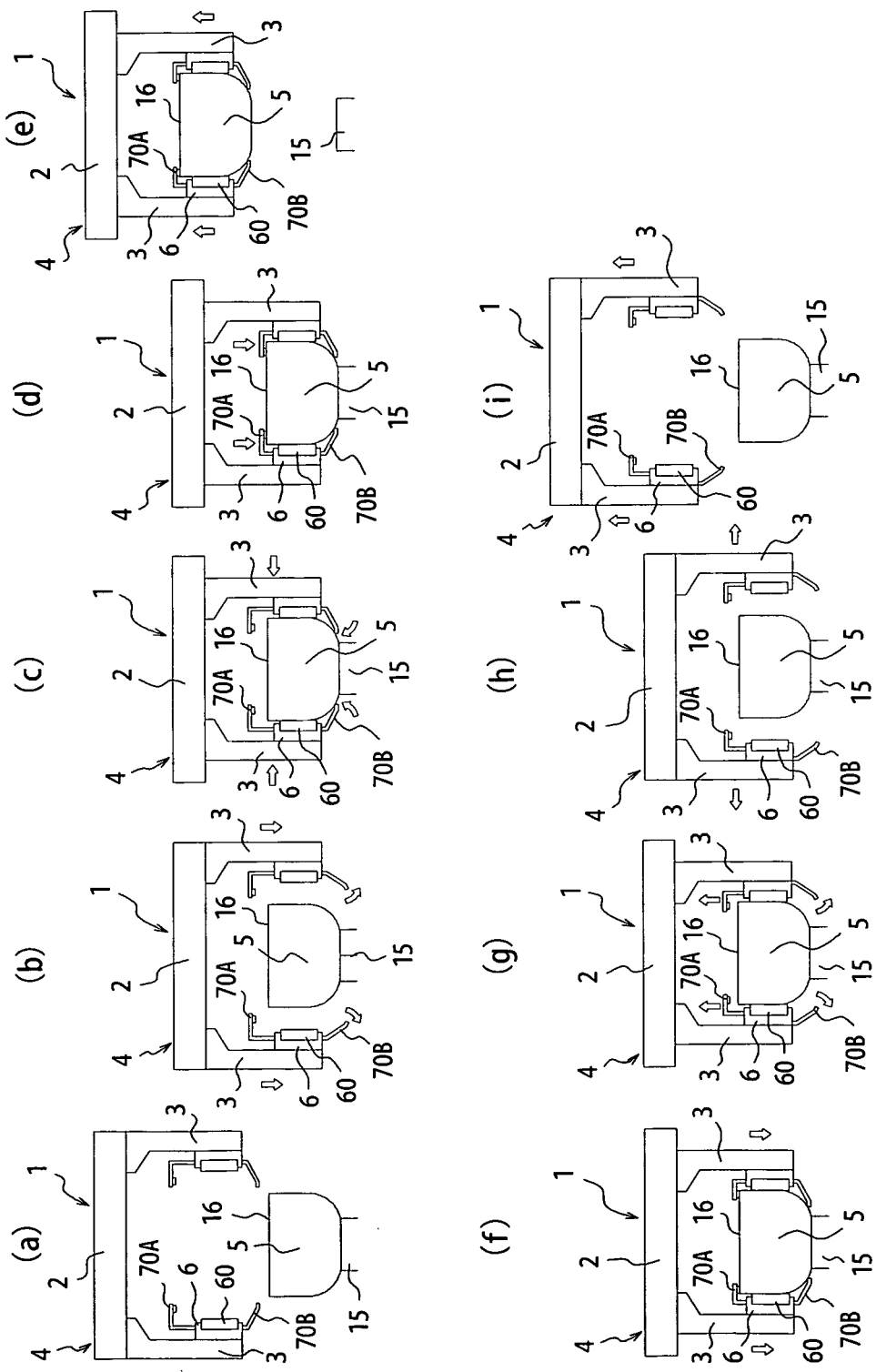
FIGS. 4A through 4I are diagrams showing other processes of handling a quartz glass crucible by using the handling device according to the present invention.

Next, with reference to the drawings, an embodiment of the present invention will be described. FIG. 1 is a perspective view showing a crucible handling device according to the present invention. FIG. 2 is a partial perspective view of the crucible handling device according to the present invention. FIGS. 3A through 3J are diagrams showing processes of handling a quartz glass crucible by using the crucible handling device according to the present invention. FIGS. 4A through 4I are diagrams showing other processes of handling a quartz glass crucible by using the handling device according to the present invention.

As shown in FIGS. 1 and 2, a crucible handling device 1 according to the present embodiment of the invention includes a frame 4 having a beam 2 extending in a horizontal direction and a pair of arms 3, 3 protruding from the beam 2 in a direction perpendicular to a central axis direction X of the beam 2 such that at least one of the arms 3, 3 is movable in the central axis direction X of the beam 2. Further, a pair of sandwiching means 6, 6 is assembled with the pair of arms 3, 3 so as to face each other, for sandwiching a body 50 of a quartz glass crucible 5 in a radial direction of the crucible. Each of the sandwiching means 6, 6 is formed by two rollers 60, 60 spaced apart from each other, and an axis line of each of the rollers 60, 60 extends in a central axis direction Y of the crucible. An outer peripheral layer 60a of each roller 60 is formed by urethane-based elastomer having elasticity. Further, adjacent to each of the sandwiching means 6, there is provided engagement means 7 formed by a pair of tongues 70A, 70B movable to approach or be separated from each other in the central axis direction of the crucible, for sandwiching and holding the quartz glass crucible 5 in the central axis direction Y of the crucible. The tongue 70A can move in the central axis direction Y of the crucible, and the tongue 70B can be pivoted around a base point thereof, serving an axis, at which the tongue 70B is attached to the arm 3, such that the tongue 70B is swingable with respect to the central axis line direction Y of the crucible. Note that a contact portion of the tongue 70B with the crucible is formed by the urethane-based elastomer. Furthermore, there is provided driving means 8 for causing the frame to reciprocate along the central axis Y of the quartz glass crucible 5. Yet further, to the arms 3, 3, there is attached pivoting means 9 for pivoting the quartz glass crucible 5 around an imaginary line Z passing through the pair of sandwiching means 6, 6 and extending in a direction perpendicular to the central axis line Y of the crucible.

By expanding/retracting an air cylinder 10A attached to the beam 2 in the central axis direction X of the beam 2, the pair of arms 3, 3 are moved in the central axis direction X of the beam 2 (see the hatched arrow in FIG. 2). Synchronous with the movement of the arm 3 as described above, the sandwiching means 6 and the engagement means 7 attached to the arm 3 move in the central axis line direction X of the beam 2. Further, an air cylinder 10B that expands/retracts in the central axis direction Y of the crucible is coupled to the tongue 70A, whereby the tongue 70A expands/retracts in the central axis direction Y of the crucible by expansion/retraction of the air cylinder 10B in the central axis direction Y of the crucible (see a blackened arrow in FIG. 2). An air cylinder 10C is coupled to the tongue 70B, whereby the tongue 70B is driven by the air cylinder 10C and swung with respect to the central axis line direction Y of the crucible around the base point, serving as an axis, at which the tongue 70B is attached to the arm 3 (see the white or outline-only arrow in FIG. 2). Furthermore, the driving means 8 for causing the frame 4 to reciprocate along the central axis line Y of the quartz glass crucible 5 is provided so as to be linked with the frame 4, whereby the frame 4, driven by the driving means 8, makes reciprocating movement along the central axis line Y of the quartz glass crucible 5. Furthermore, the pivoting means 9 is configured such that: a rotating motor 11 is linked with a shaft rod 12 provided within the beam 2; a toothed wheel 13A is mounted to the shaft rod 12; a toothed wheel 13B is mounted to a base portion of the sandwiching means 6 and the engagement means 7 on the arm 3 side; and the toothed wheels 13A and 13B are coupled with each other via a toothed belt 14. When the rotating motor 11 is driven, the shaft rod 12 rotates, the rotation force is transferred to the sandwiching means 6 and the engagement means 7 through the toothed wheels 13A, 13B and the toothed belt 14, and the sandwiching means 6 and the engagement means 7 are rotated. Note that, from the viewpoint of ensuring the satisfactory cleanliness, it is preferable to use the air cylinder as described above rather than a hydraulic cylinder from which oil may leak. From the same viewpoint, it is preferable to use a toothed belt as described above, rather than a metal chain which may generate metal powder due to wear of the chain.

The process of handling a quartz glass crucible by using the crucible handling device 1 as described above is illustrated in FIGS. 3 and 4. The detail of the process will be described hereinbelow.

First, as shown in FIG. 3A, the quartz glass crucible 5 is placed on a packing stage table 15. Next, as shown in FIG. 3B, the handling device 1 is lowered so as to dispose the rollers 60 of the sandwiching means 6 of the handling device 1 at the side of the body 50 of the quartz glass crucible 5. At this time, the tongue 70B is swung downward. Next, as shown in FIG. 3C, the arms 3 are moved toward the crucible side in the central axis direction X of the beam 2 such that the body 50 of the quartz glass crucible 5 is sandwiched by the rollers 60 and the tongue 70B is swung upward. Then, as shown in FIG. 3D, the tongue 70A is lowered to hold the quartz glass crucible 5 between the tongues 70A and 70B. In this state, as shown in FIG. 3E, the quartz glass crucible 5 is lifted up. The raised quartz glass crucible 5 is rotated by 180 degrees by the pivoting means 9 as shown in FIG. 3F to turn the crucible upside down such that an opening portion 16 of the quartz glass crucible 5 faces downward. Thereafter, the reversed quartz glass crucible 5 is placed on the packing stage table 15 again (see FIG. 3G). Then, as shown in FIG. 3H, the tongue 70A is lowered while the tongue 70B is swung upward, such that the engagement with the quartz glass crucible 5 between the tongues 70A and 70B is released. Next, as shown in FIG. 3I, the arms 3 are moved away from the crucible in the central axis direction X of the beam 2, and the sandwiching of the body 50 of the quartz glass crucible 5 by the rollers 60 is released. Finally, as shown in FIG. 3J, the handling device 1 is moved upward.

Note that, although the quartz glass crucible 5 is placed on the packing stage table 15 again after being rotated in the handling process described above, the rotation of the quartz glass crucible 5 is not necessarily required. Depending on applications, it is possible as shown in FIGS. 4A-4I to place the quartz glass crucible again on the packing stage table 15 without implementing the process of rotating the raised quartz glass crucible 5. Alternatively, although not shown in the drawings, it is possible that the lifted-up quartz glass crucible 5 is rotated by 90 degrees and then the quartz glass crucible 5 in a horizontally lying position is placed again on the packing stage table 15.

With the configuration as described above, by sandwiching and holding the quartz glass crucible 5 by the sandwiching means 6 and the engagement means 7, the quartz glass crucible is firmly sandwiched and thus reliable transfer of the crucible thereafter is ensured. This provides an advantageous effect, in particular, on a handling operation at the time of mechanically packing a large-size quartz glass crucible 5. As described above, when the quartz glass crucible 5 is mechanically packed according to the current practice, the quartz glass crucible is generally packed with a single layer of a highly cleaned clean bag under a clean environment and then packed with at least one normal bag having less cleanliness than the clean bag. In the present embodiment, the quartz glass crucible 5 packed with at least one bag can be firmly sandwiched when the crucible is mechanically sandwiched, raised and rotated by using the crucible handling device 1 of the present invention, whereby the sandwiched crucible can be reliably transferred without slipping and falling of the quartz glass crucible 5 if there exists a slippery packing member between the crucible and the handling device. In a structure other than that of the present invention, in particular, in a case where the handling device lacks one of the sandwiching means and the engagement means, the quartz glass crucible is not firmly sandwiched in a satisfactory manner and may slip off from the handling device. For example, in a case where a device structure lacking the engagement means 7 is employed, when a large-size quartz glass crucible, for example, having a diameter of 81 cm and a weight of 60 kg is sandwiched by the sandwiching means, there is a possibility that the sandwiched quartz glass crucible slips off from such the device.

Further, as the material for the outer peripheral layer 60a of the roller 60 of the sandwiching means 6 and the contact portion of the tongues 70A, 70B of the engagement means 7 with the crucible, it is possible to employ a natural rubber, polybutadiene rubber, acrylic rubber, silicone rubber, polyurethane and the like, other than the urethane-based elastomer described above. Since the performance required of the rollers varies depending on the size or shape of the quartz glass crucible, the configuration of the handling device 1 and other characteristics, it is possible to change the material, composition and the like of the rollers according to the desired performance.

It should be noted that what has been described above exemplifies merely a part of the embodiment of the present invention and it is possible to combine these configurations with each other or apply various modifications thereto without departing from the spirit of the present invention.

EXAMPLE

Next, evaluation of the handling operation of a quartz glass crucible is made by using a conventional handling device (Conventional Example device) having a configuration similar to that of the crucible handling device of the present invention, except that the former lacks the engagement means, and the handling device of the present invention (Present Example device) having the engagement means as shown in FIG. 1, respectively.

Examination is made by using the Conventional Example device and the Present Example device as described above, respectively, regarding whether the position at which each device sandwiched a quartz glass crucible having a diameter of 812 mm and a weight of 60 kg has been shifted or not from the original position after the crucible was sandwiched, lifted up and rotated three times by each handling device. Such examinations are repeated by 100 times for each of the devices.

As a result, the position at which the quartz glass crucible is sandwiched is shifted two times among 100 times in the cases of the Conventional Example device, while no shifting of the quartz glass crucible-sandwiching position is observed in the cases of the Present Example device.

[Industrial Applicability]

As can be clearly understood from the description above, according to the present invention, it is possible to provide a crucible handling device that can firmly sandwich and reliably move a quartz glass crucible under a clean environment. Further, it is possible to provide a method of handing a quartz glass crucible using the crucible handling device.

What is claimed is:

1. A crucible handling device for sandwiching and moving a quartz glass crucible, comprising:
    a frame having a beam extending in a horizontal direction and a pair of arms protruding from the beam in a direction perpendicular to a central axis direction of the beam such that at least one of the arms is able to move in the central axis direction of the beam;
    a pair of sandwiching means assembled with the pair of the arms to face each other, configured for sandwiching and holding a body of the quartz glass crucible in a radial direction of the quartz glass crucible;
    engagement means provided adjacent to each sandwiching means and formed by a pair of tongues movable to approach or be separated from each other in a central axis direction of the quartz glass crucible, configured for sandwiching and holding the quartz glass crucible between the tongues in the central axis direction of the quartz glass crucible;
    driving means configured for causing the frame to reciprocate along the central axis of the quartz glass crucible; and
    pivoting means attached to each of the arms, configured for pivoting the quartz glass crucible around an imaginary line passing through the pair of sandwiching means and extending in a direction perpendicular to the central axis of the crucible;
    wherein the pivoting means is configured such that a rotating motor is linked with a shaft rod provided within the beam; a toothed wheel is mounted to the shaft rod; a toothed wheel is mounted to a base portion of the sandwiching means and the engagement means on the arm side; and the toothed wheels are coupled with each other via a toothed belt; and
    wherein at least one of the pair of tongues is swingable with respect to the central axis direction of the quartz glass crucible.

2. The quartz glass crucible handling device according to claim 1, wherein each sandwiching means has at least one roller and an axis line of each roller extends in the central axis direction of the quartz glass crucible.

3. The quartz glass crucible handling device according to claim 2, wherein the sandwiching means includes a plurality of rollers and that the plurality of rollers are spaced apart from each other.

4. The quartz glass crucible handling device according to claim 2, wherein each roller has an elastic layer in the outer periphery thereof.

5. The quartz glass crucible handling device according to claim 1, wherein the pair of tongues each include an elastic member.

6. A method for handling a quartz glass crucible, the method comprising:
   providing a quartz glass crucible handling device of claim 1;
   sandwiching a body of the quartz glass crucible placed on a stage in the radial direction of the quartz glass crucible;
   sandwiching and holding the quartz glass crucible placed on the stage in the central axis direction of the quartz glass crucible;
   lifting up the quartz glass crucible;
   placing the quartz glass crucible on the stage again; and
   releasing the quartz glass crucible from the sandwiching and holding engagement by the quartz glass crucible handling device.

7. The method of handling a quartz glass crucible according to claim 6, further comprising pivoting the quartz glass crucible after lifting up the quartz glass crucible.

* * * * *